United States Patent
Yang et al.

(10) Patent No.: US 11,955,357 B2
(45) Date of Patent: Apr. 9, 2024

(54) IN-SITU TEMPERATURE CONTROLLING SAMPLE STAGE CUSTOMIZED FOR COUPLED INTERCONNECTION BETWEEN IN-SITU HIGH-PRESSURE REACTION CELL AND ULTRAHIGH VACUUM CHARACTERIZATION

(71) Applicant: SHANGHAITECH UNIVERSITY, Shanghai (CN)

(72) Inventors: Yong Yang, Shanghai (CN); Xiaohong Zhou, Shanghai (CN); Evgeny Vovk, Shanghai (CN); Jiafeng Zhao, Shanghai (CN)

(73) Assignee: SHANGHAITECH UNIVERSITY, Shanghai (CN)

( * ) Notice: Subject to any disclaimer, the term of this patent is extended or adjusted under 35 U.S.C. 154(b) by 458 days.

(21) Appl. No.: 17/367,526

(22) Filed: Jul. 5, 2021

(65) Prior Publication Data

US 2023/0005769 A1 Jan. 5, 2023

(51) Int. Cl.
*H01L 21/67* (2006.01)
*H01L 21/673* (2006.01)

(52) U.S. Cl.
CPC .. *H01L 21/67248* (2013.01); *H01L 21/67103* (2013.01); *H01L 21/67379* (2013.01)

(58) Field of Classification Search
CPC ......... H01L 21/67248; H01L 21/67103; H01L 21/67379
USPC ...................................................... 73/863.11
See application file for complete search history.

(56) References Cited

U.S. PATENT DOCUMENTS

| | | | | |
|---|---|---|---|---|
| 6,910,394 B2* | 6/2005 | Kriel | ...................... | G01N 30/20 73/863.11 |
| 8,371,182 B1* | 2/2013 | Israelachvili | .......... | G01Q 30/20 73/862.541 |
| 8,516,909 B2* | 8/2013 | Lihl | ........................ | G01N 1/42 73/863.11 |
| 2010/0184229 A1* | 7/2010 | Haas | ..................... | G01N 1/4022 422/418 |
| 2013/0133441 A1* | 5/2013 | Volckens | ............. | G01N 1/2202 62/3.6 |
| 2015/0143929 A1* | 5/2015 | Volckens | ............. | G01N 1/2273 73/863.11 |
| 2015/0185117 A1* | 7/2015 | Schmitz | ................... | G01N 1/44 219/521 |

* cited by examiner

*Primary Examiner* — Nathaniel T Woodward
(74) *Attorney, Agent, or Firm* — Global IP Services; Tianhua Gu

(57) ABSTRACT

The present disclosure relates to an in-situ temperature control platform, including an independent sample holder, a sample holder fixing cartridge, a customized sample stage and an anode contact pin. The independent sample holder includes a sample loading spot and a sample holder grip. The sample holder fixing cartridge includes a fixing cartridge body, the fixing cartridge body is provided with a sample holder slot, the bottom surface of the sample holder slot is provided with a heating element slot, and the sample holder slot is aligned with the sample loading spot. The bottom surface of the heating element slot is provided with a heating element fixing pinhole. The customized sample stage includes a sample stage body, the sample stage body is provided with a heating element support, and the heating element support is provided with a heating element.

10 Claims, 2 Drawing Sheets

IN-SITU TEMPERATURE CONTROLLING SAMPLE STAGE CUSTOMIZED FOR COUPLED INTERCONNECTION BETWEEN IN-SITU HIGH-PRESSURE REACTION CELL AND ULTRAHIGH VACUUM CHARACTERIZATION

TECHNICAL FIELD

The present disclosure relates to the field of detection, and in particular, to an in-situ temperature control stage customized for coupled interconnection between an in-situ high-pressure reaction cell and an ultrahigh vacuum characterization.

BACKGROUND

The traditional characterization technology, which uses the effects related with photon, electron, ion, atom and the like for observing or preparing the surface structure of solid or liquid materials, generally requires the equipment to run in ultrahigh vacuum (UHV) environment. UHV characterization system is the general name of this kind of mainstream high-precision surface analysis instruments, which covers large platform instrumentations including X-ray photoelectron spectroscopy (XPS), transmission electron microscope (TEM), scanning electron microscope (SEM), scanning tunneling microscope (STM), mass spectrometer (MS), Auger electron spectroscopy (AES), Low Energy Electron Diffraction (LEED), High Resolution Electron Energy Loss Spectroscopy (HREELS), Low Energy Ion Scattering (LEIS), Angle Resolved Photoelectron Spectroscopy (ARPES), Molecular Beam Epitaxy (MBE), etc. The coupled interconnection of UHV characterization equipment with in-situ high-temperature and high-pressure preparation simulating industrial conditions or on-line characterization devices is widely applied in surface analysis science, material science, semiconductor devices, microelectronics, catalysis and other fields at present and in the future.

The traditional routine preparation method for analysis in UHV systems includes first preparing the sample on the standard sample stage, then transferring the sample to the sample preparation chamber for pre-vacuumization, and finally transferring the sample to the analysis chamber for measurement after the vacuum degree meets the requirements (usually $10^{-6}$ Pa). If the sample surface is not sensitive, the vacuum protection can ensure that during the measurement period, the number of surrounding gas molecules contacted/adsorbed on the sample surface is much less than the number of surface monolayer (ML) molecules, thus protecting the sample from being contaminated during the measurement process. However, before this process, the sample is generally exposed to the external environment, and the surface is easily contaminated due to oxidation and deliquescent, which may change the original properties of the sample, making the analysis results deviate from the characterization purpose. Even if a traditional commercial sample transfer device is used to protect the sample, damage to the sample surface is still inevitable, since the ultimate vacuum level can only be limited to several Pa, which is much higher than that of UHV. Therefore, some commercial photoelectron spectroscopy sample stage provides upgraded surface activation functions such as in-situ heating. However, samples that are sensitive to the preparation process, such as catalyst surface prepared under different reaction conditions, cannot be activated only by vacuum heating due to the experimental conditions requirements. Before XPS analysis, it is necessary to perform in-situ high-temperature and high-pressure pretreatment (such as heating, oxidation, reduction and in-situ chemical reaction) preparation and on-line characterization under simulated industrial conditions in a high-pressure reaction cell. After these pretreatments or chemical reactions, the sample is then transferred through a vacuum interconnection (typically $10^{-6}$ pa) to an XPS analysis chamber for analysis. Such in-situ reaction setups require the sample to be loaded on an independent sample holder that can be separated from the photoelectron spectroscopy sample stage for vacuum coupled interconnect transfer operations. At present, however, there is no sample stage that can provide in-situ heat under vacuum analysis condition and is compatible with the aforementioned separable independent sample holder for vacuum interconnection work conditions. For the samples that need to be prepared in-situ, the function of secondary sample heating during UHV characterization analysis (such as TPD, TP-XPS, etc.) is completely limited. The lack of secondary sample heating function in analysis is one of the major shortcomings of coupling a UHV system and a high pressure reaction cell at present.

SUMMARY

The present disclosure provides an in-situ temperature control stage customized for coupled interconnection between an in-situ high pressure reaction cell and an ultrahigh vacuum characterization.

The present disclosure provides an in-situ temperature control stage, including an independent sample holder, a sample holder fixing cartridge, a customized sample stage, and an anode contact pin. The independent sample holder includes a sample loading spot and a sample holder grip.

The sample holder fixing cartridge includes a fixing cartridge body, the fixing cartridge body is provided with a sample holder slot, the bottom surface of the sample holder slot is provided with a heating element slot, the sample holder slot is aligned to the sample loading spot, and the bottom surface of the heating element slot is provided with a heating element fixing pinhole.

The customized sample stage includes a sample stage body, the sample stage body includes a heating element support, the heating element support is provided with a heating element, the heating element is electrically connected with the anode contact pin and the sample stage body, respectively, and the sample stage body is further provided with a contacting thermocouple.

In some embodiments of the present disclosure, the side wall of the sample holder slot is provided with a sample holder clip.

In some embodiments of the present disclosure, the in-situ temperature control stage further includes a sample holder connector, and the fixing cartridge body is connected to the sample stage body through the sample holder connector, preferably, the fixing cartridge body is detachably connected to the sample stage body through the sample holder connector.

In some embodiments of the present disclosure, the heating element may be inserted into the heating element slot through the heating element fixing pinhole.

In some embodiments of the disclosure, the contacting thermocouple is a thermocouple clip.

In some embodiments of the disclosure, the sample loading spot is provided with a pellet hole, and the position of the pellet hole is aligned with that of the heating element slot.

In some embodiments of the present disclosure, the pellet hole is cylindrical, the heating element slot is cylindrical, the heating element is spiral, and the heating element fixing pinhole is located at the center of the bottom surface of the heating element slot.

In some embodiments of the present disclosure, the in-situ temperature control stage is used for a technique of coupled interconnection transfer between an in-situ high pressure reaction cell and an ultrahigh vacuum characterization.

Another aspect of that present disclosure provides an ultrahigh vacuum characterization system including the above-mentioned in-situ temperature control stage.

In some embodiments of the disclosure, the ultrahigh vacuum characterization system is selected from the group consisting of X-ray photoelectron spectroscopy, transmission electron microscopy, scanning electron microscopy, scanning tunneling microscopy, mass spectrometry, Auger electron spectroscopy, low-energy electron diffraction spectroscopy, high-resolution electron energy loss spectroscopy, low-energy ion scattering, angle-resolved photoelectron spectroscopy and molecular beam epitaxy.

Figure 1:
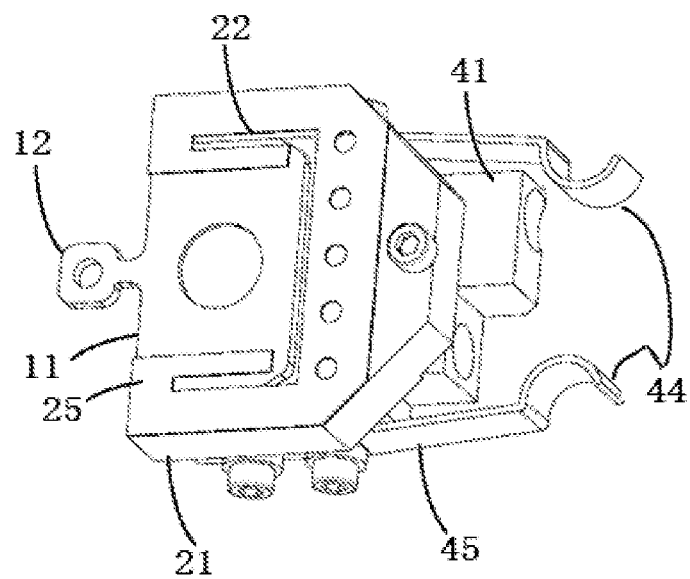
FIG. 1 shows a schematic view of the assembly structure of the present disclosure.

DESCRIPTION OF REFERENCE NUMERALS 1 independent sample holder
11 sample loading spot
12 sample holder grip
2 sample holder fixing cartridge
21 fixing cartridge body
22 sample holder slot
23 heating element slot
24 heating element fixing pinhole
25 sample holder clip
26 sample holder connector
3 anode contact pin
31 insulating O-ring
32 anode conductive pin
4 customized sample stage
41 sample stage body
42 heating element support
43 heating element
44 contacting thermocouple
45 thermocouple contact spring

DETAILED DESCRIPTION OF THE EMBODIMENTS

Embodiments of the present disclosure are described below, and other advantages and benefits of the present disclosure will become readily apparent to those skilled in the art from the disclosure herein.

Figure 2:
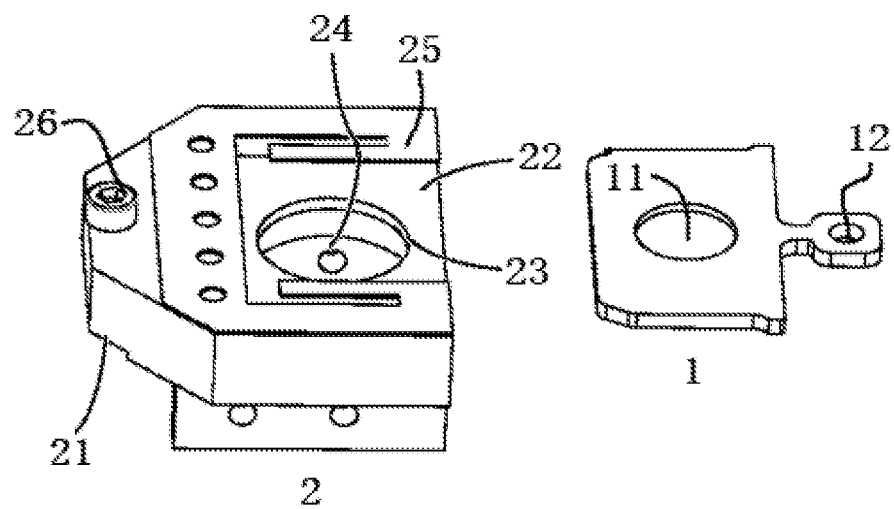
FIG. 2 is a schematic view showing the structure of the independent sample holder and the sample holder fixing cartridge of the present disclosure.
Figure 3:
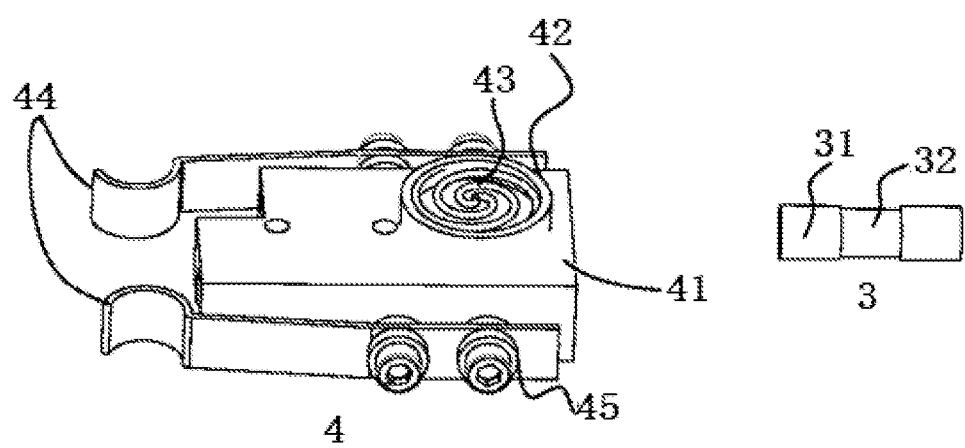
FIG. 3 is a schematic view of an anode contact pin and a customized sample stage according to the present disclosure.

See FIGS. 1-3. It should be noted that the structures, proportions, sizes, etc., shown in the drawings attached to this specification are only in conjunction with the contents disclosed in this specification, for the understanding and reading of those skilled in the art, and are not intended to limit the conditions under which the present disclosure can be implemented, and therefore do not have any technical significance. Any structural modifications, changes in proportion relationships, or adjustments in sizes should still fall within the scope of the technical contents disclosed by the present disclosure without affecting the effects and purposes of the present disclosure. At the same time, the terms such as "upper", "lower", "left", "right" and "middle" as well as "one" cited in this specification are only for the convenience of description and clarity, and are not used to limit the scope of the present disclosure. The change or adjustment of their relative relationship is considered to be within the scope of the present disclosure without substantial change in technical content.

As shown in FIGS. 1-3, the first aspect of the present disclosure provides an in-situ temperature control stage, which includes an independent sample holder 1, a sample holder fixing cartridge 2, a customized sample stage 4 and an anode contact pin 3; the independent sample holder 1 includes a sample loading spot 11 and a sample holder grip 12; the sample holder fixing cartridge 2 includes a fixing cartridge body 21, the fixing cartridge body 21 is provided with a sample holder slot 22, the bottom surface of the sample holder slot 22 is provided with a heating element slot 23, and the sample holder slot 22 and the heating element slot 23 are aligned with the sample loading spot 11; the bottom surface of the heating element slot 23 is provided with a heating element fixing pinhole 24; the customized sample stage 4 includes a sample stage body 41, the sample stage body 41 is provided with a heating element support 42, the heating element support 42 is provided with a heating element 43, the heating element 43 is electrically connected with the anode contact pin 3 and the sample stage body 41, respectively, and the sample stage body 41 is further provided with a contacting thermocouple 44. The sample to be tested can generally be placed on the sample loading spot 11 of the independent sample holder 1, so that the independent sample holder transfer function can be realized by a transfer device (for example, a mechanic arm) connected to the sample holder grip 12. The sample holder slot 22 and the heating element slot 23 are aligned with the sample loading spot 11, which generally means that the independent sample holder 1 can be transferred right above the heating element slot 23, as placed toward the sample holder slot 22 and located in the slot, and the independent sample holder 1 is positioned at the top notch of the heating element slot 23 (For example, the sample loading spot 11 may cover the notch of the heating element slot 23), so that the sample on the independent sample holder 1 is located at the notch. With this arrangement, the sample can be heated by the heating element 43 in the heating element slot 23. The contacting thermocouple 44 on the sample stage body 41 may be in contact with a thermocouple, so that the temperature of the in-situ temperature control stage can be obtained through the contacting thermocouple 44. The heating element 43 may be a heating filament, and the two ends of the heating filament may be electrically connected with the anode contact pin 3 and the sample stage body 41, respectively, so that the heating element 43 can generate heat, while the independent sample holder 1 remains insulated. The in-situ temperature control stage is compatible with the vacuum interconnection transfer function of the independent sample holder 1, and has a customized sample stage 4 for realizing the temperature control function (including heating and cooling) within the analysis chamber of the UHV characterization system as well, providing the design temperature range is generally 150-1000 K. The interconnected equipment is suitable for the in-situ pretreatment of the high-pressure reaction cell, meeting the requirements such as in-situ preparation under the simulated industrial conditions with high-temperature and high-pressure and on-line characterization etc., and it is also suitable for sample analysis requiring secondary heating in certain ultrahigh vacuum characterization, which is completely compatible for the coupled interconnection technology of the in-situ high-pressure reaction cell and the ultrahigh vacuum characterization.

In the in-situ temperature control stage provided by the present disclosure, referring to FIG. 3, a heating element support 42 and a heating element 43 located on the heating element support 42 can form an integrated heating block. The heating element 43 may be fixed on a sample stage body 41 through the heating element support 42. The material of the sample stage body 41 may be stainless steel or metallic molybdenum. The portion of the sample stage body 41 where the integrated heating block is disposed may be a plane. The heating element support 42 and the heating element 43 generally protrude from the plane, in order to be inserted into the heating element slot 23 through the heating element fixing pinhole 24. The heating element support 42 is generally a circular high-temperature heat-insulating ceramic. The heating element 43 may be a spiral, more specifically, a planar spiral, and may be made of a high-temperature resistant metal such as tungsten or tantalum. A spacer may be provided between the heating element 43 and the notch, and the spacer may be a thin sheet of pyrolytic boron nitride ceramic material, so as to reduce the contamination interference of the heating element 43 on the sample and provide contact heating.

Referring to FIG. 2, the in-situ temperature control stage provided by the present disclosure may further include a sample holder connector 26, the material of the sample holder connector 26 may be stainless steel or metallic molybdenum. The fixing cartridge body 21 is connected with the sample stage body 41 through the sample holder connector 26, preferably detachably, so that the fixing cartridge body 21 can be fixed on the sample stage body 41. For example, the sample holder connector 26 may be a screw or the like, and the fixing cartridge body 21 and the sample stage body 41 are provided with corresponding screw holes. The sample loading spot 11 of the independent sample holder 1 may be a plate body. The whole material of the independent sample holder 1 may be stainless steel or metallic molybdenum. The sample loading spot 11 may be provided with a pellet hole, and the pellet hole may generally penetrate through the plate body, so that the sample can be filled and/or pressed in the pellet hole. When the independent sample holder 1 is located in the sample holder slot 22 and the sample loading spot 11 covers the notch of the heating element slot 23, the pellet hole can generally be located above the notch of the heating element slot 23, so that the sample can be uniformly heated by the heating elements 43. The structure of the independent sample holder 1 in the present disclosure is completely consistent with the operation mode of the original independent sample holder 1 for vacuum interconnection transfer operation in the traditional equipments, and is compatible with the original vacuum transfer design. In a specific embodiment of the present disclosure, the independent sample holder 1 may be a sample holder suitable for various vacuum characterization sample heating stages, specifically, the independent sample holder 1 may be a flag-shaped sample holder commonly used in vacuum equipment transfer, and the supporting instrumentation platform is a ThermoFisher ESCALAB 250Xi XPS characterization apparatus. The side wall of the heating element slot 23 and the sample holder slot 22 may be provided with a sample holder clip 25 which is matched with the independent sample holder 1. For example, the sample holder clip 25 may be fixed spring pieces. For another example, the sample holder clips 25 may be made of a polished elastic metal material with high temperature resistance and low vapor pressure, and may be square in shape, so that the independent sample holder 1 can be fixed in the groove. The two fixing spring pieces may be parallel to each other, and one end of the fixed spring pieces may be spot-welded to the fixing cartridge body 21, respectively, so as to form two parallel rails extending along the slot entry and having rail openings facing each other. The length of the rails may be 12 mm±0.5 mm, and the width of the rails may be 18 mm±0.2 mm, so that the independent sample holder 1 can be inserted into the rails. The free end of the fixed spring piece may gradually approach to the surface of the fixing cartridge body 21, for example, the free end may gradually approach to the bottom surface of the sample holder slot 22 of the fixing cartridge body 21 at a distance of 5 mm from the fixed end, and the free end is in contact with the bottom surface of the sample holder slot 22 of the fixing element body 21, so as to ensure that the independent sample holder 1 is subjected to uniform pressure and forms surface contact with the sample holder fixing cartridge 2 at the bottom of the sample holder slot 22. In yet another embodiment of the present disclosure, the pellet hole may be cylindrical, with a depth range of 0.5±0.1 mm and a diameter of 6.0±0.5 mm. The heating element slot 23 may be cylindrical, with a diameter of 10.6±0.1 mm and a depth of 2.5±0.1 mm. The heating element fixing pinhole 24 has a diameter of 1.6±0.05 mm and is located at the center of the bottom surface of the heating element slot 23. The circle centers of the sample loading spot 11, the heating element slot 23 and the heating element 43 are on the same vertical line.

In the in-situ temperature control stage provided by the present disclosure, the sample stage body 41 may be a metal block provided with an inner cavity. The anode contact pin 3 may be placed in the inner cavity of the sample stage body 41. The anode contact pin 3 may include an anode conductive pin 32 and an insulating O-ring 31 covering both ends of the anode conductive pin 32, thereby ensuring that the anode contact pin 3 is completely insulated from the sample stage body 41. The heating power can be introduced by aligning the inner diameter and positioning of the anode conductive pin 32 with the probe-type power output electrode provided inside the UHV equipment. The negative electrode is provided by the sample stage body 41 itself, which is installed in a grounded manner, so that the heating power output provided from the instrumentation can be streamed by connecting the first and second plug probes of the spectrometer analysis chamber through the above structure.

In the in-situ temperature control stage provided by the disclosure, a K-type thermocouple may be used for temperature sampling, and the design of all types of thermocouples and thermal resistors is completely compatible. For example, the contacting thermocouple 44 may be a thermocouple clip made of stainless steel, and the thermocouple clip may include a first thermocouple contact spring 45 and a second thermocouple contact spring 45, which may be fixed on and insulated from the customized sample stage 4 by a thermocouple fixing element (for example, a screw) and an insulating element (for example, an insulating ceramic O-ring). One end of the contacting thermocouple 44 is in contact with spot welding of the thermocouple wires to read the temperature data, and the other end of the contacting thermocouple 44 is pinned by the fixing elements on the thermocouple contact spring 45 which clamping the sample stage body 41, so that the temperature data can be transferred to a temperature data input port of an ultrahigh vacuum instrument which is in contact with it.

In the in-situ temperature control stage provided by the disclosure, the low temperature control can be carried out by liquid nitrogen (for example, the UHV liquid nitrogen cooling assembly in the traditional ultrahigh vacuum characterization system), specifically, liquid nitrogen is introduced into a cooling pipeline installed in an analysis chamber by using a cold trap, and the liquid nitrogen in the cooling pipeline reaches a copper cooling block in the analysis chamber. The customized sample stage 4 exchanges heat with the cooling block through contact to realize low-temperature cooling.

A second aspect of the present disclosure provides a UHV characterization system including an in-situ temperature control stage as provided in the first aspect of the present disclosure. The ultra-vacuum characterization system may be a system including, but not limited to, X-ray photoelectron spectroscopy (XPS), TEM (transmission electron microscopy), SEM (scanning electron microscopy), STM (scan tunneling microscope), MS (mass spectrometer), AES (Auger electron spectroscopy), LEED (low energy electron diffraction spectroscopy), HREELS (high resolution electron energy loss spectroscopy), LEIS (Low Energy Ion Scattering), ARPES (Angle Resolved Photoelectron Spectroscopy), MBE (Molecular Beam Epitaxy) and other instruments.

The present disclosure overcomes the difficulty induced by the narrow operation and transfer space of the analysis chamber of the UHV characterization equipment, and designs an optimized scheme of an in-situ heating sample stage which is compatible with the vacuum transfer of a high-pressure reaction cell and the UHV characterization equipment. The main advantages of the present disclosure lie in:

1. The customized sample stage 4 is minimized in volume and thickness, and only the anode contact pin 3 which can be contacted with one end of the heating element 43 is placed inside, and the anode contact pin 3 is composed of coaxial parts including two insulating O-rings 31 and an anode conductive pin 32.
2. By using an open filament structure (left side of FIG. 2), the entire integrated heating block floats above the upper surface of the customized sample stage 4, and is embedded in the heating element slot 23, directly heating the sample loading spot 11.
3. Base on the minimization of the customized sample stage 4, on the premise of not affecting the normal operation and transfer mode of the analysis chamber of the UHV characterization equipment, the method accurately measures, maximizes the volume and thickness of the fixing slot of the sample holder, and is 100% compatible with the transfer mode of universal independent sample holder 1 which is vacuum-connected with a high-pressure reaction cell.
4. All heating circuits and insulators are arranged in the design structure of the floating embedded heating element, which is the core part of the present disclosure. By this design, the thickness of the metal bulk portion of the customized sample stage 4 is minimized. And therefore, enough space is saved for placing the fixing slot of the sample holder, and the standard sample transfer mode is ensured. At the same time, this design is structurally independent from the customized sample stage 4 and sample holder fixing cartridge 2, which are made of good metal thermal conductors, reducing the heating level of other components on these two components. The heating is more concentrated at the sample location, thus the temperature control is more effective. Therefore, this design can also reduce the heating power to achieve the same temperature ramping effect. The advantages of this design for measurement and control are to increase the sensitivity of temperature control, especially in the low temperature range, and to reduce the adverse factors such as vacuum heating induced degas, which are harmful to vacuum measurement.

The in-situ temperature control sample stage of the UHV characterization equipment designed by the present disclosure can be compatible with the in-situ preparation and characterization functions of a high-pressure reaction cell and an analysis chamber of the UHV characterization equipment, can realize the in-situ pretreatment and online characterization of a sample in the high-pressure reaction cell, and is also suitable for secondary temperature control measurement in the analysis chamber of the ultrahigh vacuum characterization equipment, thereby realizing the maximum compatibility of the coupled interconnection system of the high-pressure reaction cell and the UHV characterization equipment. The present disclosure not only provides an in-situ analysis temperature control stage scheme for an independent sample holder 1 in a UHV analysis chamber aiming at a ThermoFisher ESCALAB 250 Xi and its matched vacuum interconnected high pressure reaction cell, but also a design idea that is applicable to the in-situ temperature control design of other similar independent sample holders which need coupled interconnection between compatible UHV characterization equipment and high-pressure reaction cell.

In summary, the present disclosure effectively overcomes various disadvantages in the prior art and has a high industrial utilization value.

The above embodiments are merely illustrative of the principles and effects of the present disclosure, and are not intended to limit the present disclosure. Any person skilled in the art can modify or change the above embodiments without departing from the spirit and scope of the present disclosure. Therefore, all equivalent modifications or changes made by those skilled in the art without departing from the spirit and technical idea of the present disclosure should still be covered by the claims of the present disclosure.

The invention claimed is:

1. An in-situ temperature control stage, comprising an independent sample holder (1), a sample holder fixing cartridge (2), a customized sample stage (4), and an anode contact pin (3); wherein
   the independent sample holder (1) comprises a sample loading spot (11) and a sample holder grip (12);
   the sample holder fixing cartridge (2) comprises a fixing cartridge body (21), the fixing cartridge body (21) is provided with a sample holder slot (22), a bottom surface of the sample holder slot (22) is provided with a heating element slot (23), and the sample holder slot (22) is aligned with the sample loading spot (11); a bottom surface of the heating element slot (23) is provided with a heating element fixing pinhole (24);
   the customized sample stage (4) comprises a sample stage body (41), the sample stage body (41) is provided with a heating element support (42), the heating element support (42) is provided with a heating element (43), and the heating element (43) is electrically connected with the anode contact pin (3) and the sample stage body (41), respectively; the sample stage body (41) is further provided with a contacting thermocouple (44).

2. The in-situ temperature control stage according to claim 1, wherein a side wall of the sample holder slot (22) is provided with a sample holder clip (25).

3. The in-situ temperature control stage according to claim 1, further comprising a sample holder connector (26), wherein the fixing cartridge body (21) is connected to the sample stage body (41) through the sample holder connector (26), preferably, the fixing cartridge body (21) is detachably connected to the sample stage body (41) through the sample holder connector (26).

4. The in-situ temperature control stage according to claim 1, wherein the heating element (43) is capable of being inserted into the heating element slot (23) through the heating element fixing pinhole (24).

5. The in-situ temperature control stage according to claim 1, wherein the contacting thermocouple (44) is a thermocouple clip.

6. The in-situ temperature control stage according to claim 1, wherein the sample loading spot (11) is provided with a pellet hole, and the position of the pellet hole is aligned with the position of the heating element slot (23).

7. The in-situ temperature control stage according to claim 1, wherein the pellet hole is cylindrical, the heating element slot (23) is cylindrical, the heating element (43) is spiral, and the heating element fixing pinhole (24) is located at the center of the bottom surface of the heating element slot (23).

8. The in-situ temperature control stage according to claim 1, wherein the in-situ temperature control stage is used for a technique of coupled interconnection transfer between an in-situ high-pressure reaction cell and ultrahigh vacuum (UHV) characterization.

9. An ultrahigh vacuum characterization system, comprising the in-situ temperature control stage of claim 1.

10. The ultrahigh vacuum characterization system according to claim 9, wherein the ultrahigh vacuum characterization system is selected from the group consisting of X-ray photoelectron spectroscopy, transmission electron microscopy, scanning electron microscopy, scanning tunneling microscopy, mass spectrometry, Auger electron spectroscopy, low-energy electron diffraction spectroscopy, high-resolution electron energy loss spectroscopy, low-energy ion scattering, angle-resolved photoelectron spectroscopy and molecular beam epitaxy.

\* \* \* \* \*